（12） United States Patent
Ishizaka et al.

(10) Patent No.: US 9,362,166 B2
(45) Date of Patent: Jun. 7, 2016

(54) METHOD OF FORMING COPPER WIRING

(71) Applicant: TOKYO ELECTRON LIMITED, Tokyo (JP)

(72) Inventors: Tadahiro Ishizaka, Nirasaki (JP); Takashi Sakuma, Nirasaki (JP); Osamu Yokoyama, Nirasaki (JP); Kenji Matsumoto, Nirasaki (JP); Peng Chang, Nirasaki (JP); Hiroyuki Nagai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/642,331

(22) Filed: Mar. 9, 2015

(65) Prior Publication Data

US 2015/0262872 A1    Sep. 17, 2015

(30) Foreign Application Priority Data

Mar. 17, 2014   (JP) .................................. 2014-053934

(51) Int. Cl.
| | |
|---|---|
| *H01L 21/4763* | (2006.01) |
| *H01L 21/768* | (2006.01) |
| *H01L 21/285* | (2006.01) |
| *H01L 23/532* | (2006.01) |

(52) U.S. Cl.
CPC ...... *H01L 21/76877* (2013.01); *H01L 21/2855* (2013.01); *H01L 21/28556* (2013.01); *H01L 21/28568* (2013.01); *H01L 21/76843* (2013.01); *H01L 23/53238* (2013.01)

(58) Field of Classification Search
CPC ................... H01L 21/28568; H01L 21/76877; H01L 21/28556
See application file for complete search history.

(56) References Cited

U.S. PATENT DOCUMENTS

2009/0053426 A1 *   2/2009   Lu .......................... C23C 16/16
                                                            427/540

FOREIGN PATENT DOCUMENTS

| JP | 2008-300568 A | 12/2008 |
|---|---|---|
| JP | 2010-21447 A | 1/2010 |
| WO | 2012/173067 A1 | 12/2012 |

\* cited by examiner

*Primary Examiner* — Bradley K Smith
(74) *Attorney, Agent, or Firm* — Nath, Goldberg & Meyer; Jerald L. Meyer

(57) ABSTRACT

A method of forming a copper wiring buried in a recess portion of a predetermined pattern formed in an interlayer insulation layer of a substrate is disclosed. The method includes: forming a manganese oxide film at least on a surface of the recess portion, the manganese oxide film serving as a self-aligned barrier film through reaction with the interlayer insulation layer; performing hydrogen radical treatment with respect to a surface of the manganese oxide film; placing a metal more active than ruthenium on the surface of the manganese oxide film after the hydrogen radical treatment; forming a ruthenium film on the surface where the metal more active than ruthenium is present; and forming a copper film on the ruthenium film by physical vapor deposition (PVD) to bury the copper film in the recess portion.

6 Claims, 16 Drawing Sheets

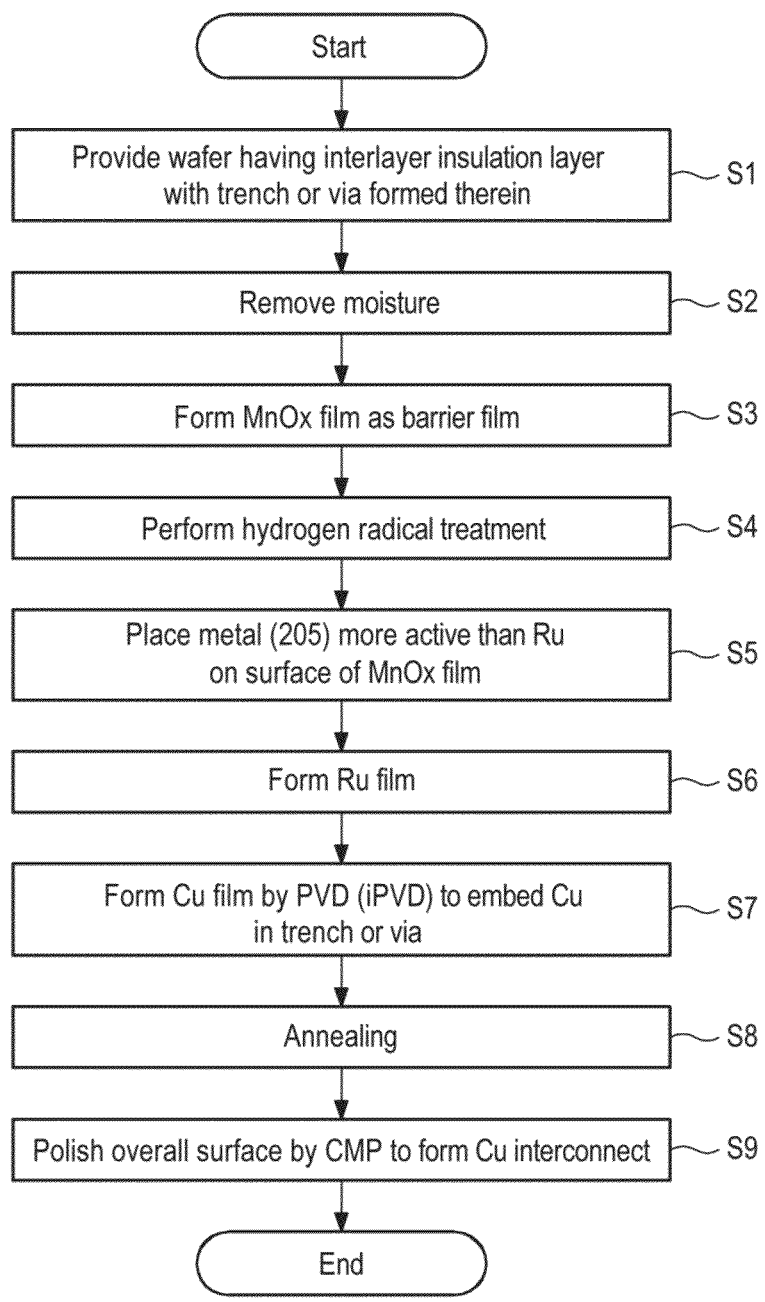

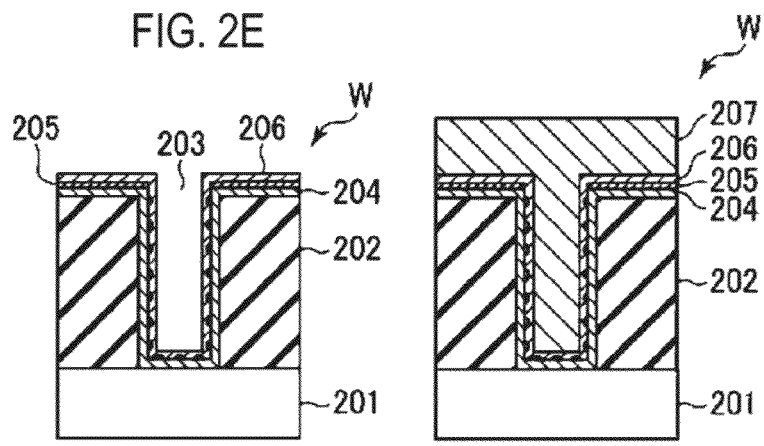
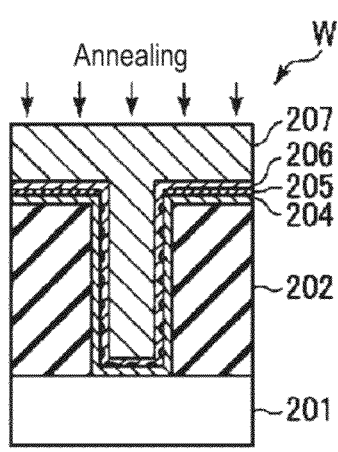
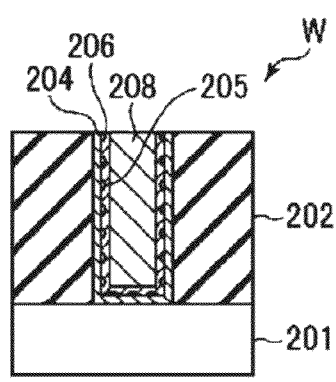

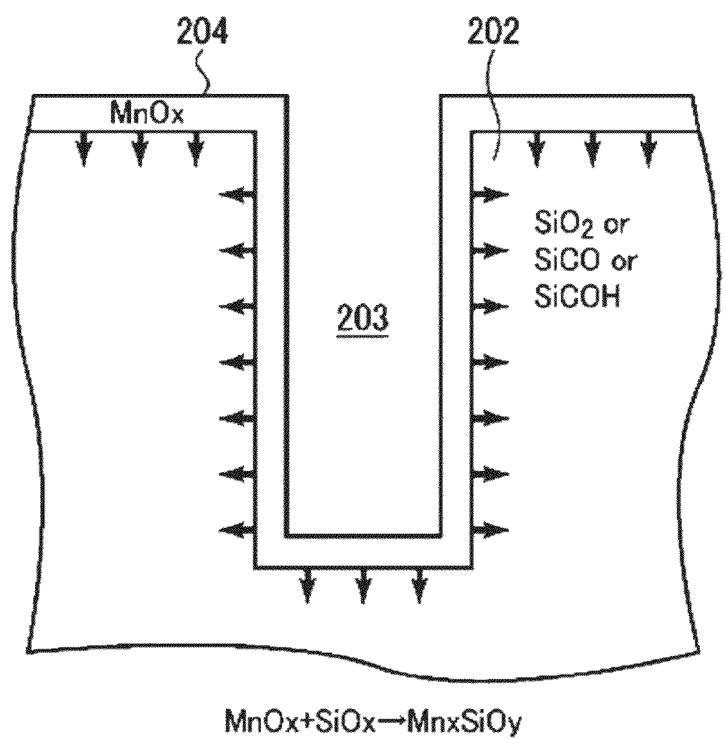

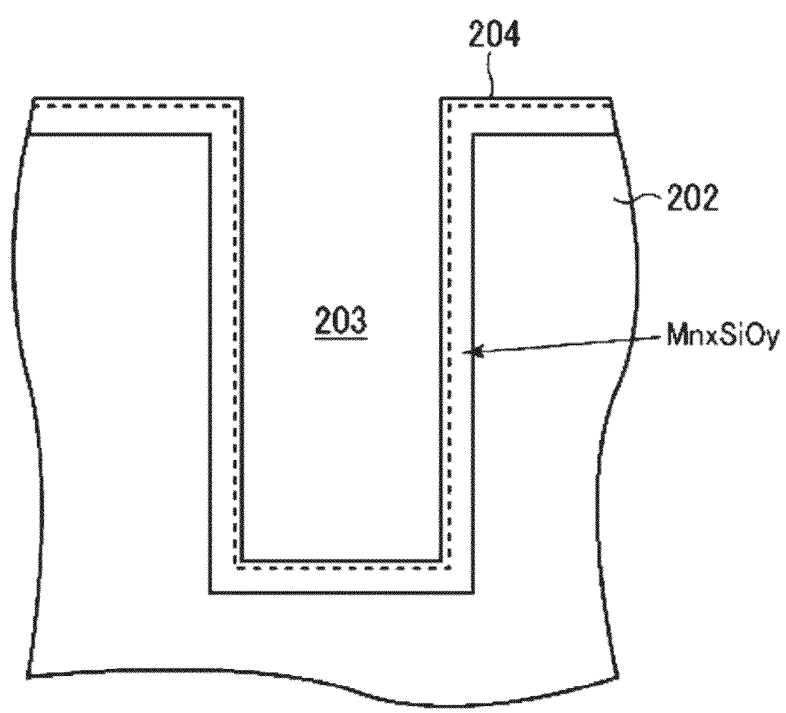

METHOD OF FORMING COPPER WIRING

CROSS-REFERENCE TO RELATED APPLICATION

This application claims the benefit of Japanese Patent Application No. 2014-053934, filed on Mar. 17, 2014, in the Japan Patent Office, the disclosure of which is incorporated herein in its entirety by reference.

TECHNICAL FIELD

The present disclosure relates to a method of forming a copper wiring by burying copper in a recess portion, such as a trench or a hole, formed in a substrate.

BACKGROUND

In manufacturing semiconductor devices, semiconductor wafers are repeatedly subjected to various processes such as a film forming process, an etching process or the like in order to manufacture desired devices. Recently, semiconductor devices have been required to have high speed, a fine wiring pattern, and a high level of integration. In this regard, a wiring needs to have lower resistance (improvement in conductivity) and more enhanced electromigration tolerance.

In accordance with these needs, copper (Cu) having higher electromigration tolerance and higher conductivity (lower resistance) than aluminum (Al) or tungsten (W) has been employed as a wiring material.

A copper wiring is formed by forming trenches or holes in an interlayer insulation layer and burying copper in the trenches or holes. In this case, a barrier film is formed prior to burying copper in order to prevent diffusion of copper into the interlayer insulation layer.

Although films formed of tantalum (Ta), titanium (Ti), tantalum nitride (TaN) or titanium nitride (TiN) by physical vapor deposition (PVD) have been used as the barrier film, these films may not provide sufficient step coverage as a wiring pattern is gradually being miniaturized. Thus, in recent years, a $MnO_x$ film, which can be formed into a thin film with good step coverage by using a chemical vapor deposition (CVD) method, has been suggested as the barrier film. However, since the $MnO_x$ film exhibits low adhesion to a copper film, there is proposed a method in which a ruthenium (Ru) film having high adhesion to copper is first formed on the $MnO_x$ film and then a copper film is formed on the ruthenium film to form a copper wiring.

On the other hand, since a good quality ruthenium film is difficult to obtain due to low nucleation density of ruthenium in forming the ruthenium film on the $MnO_x$ film, there is proposed a technology in which hydrogen radical treatment is performed after forming a $MnO_x$ film and then the ruthenium film is formed.

However, along with the progress of the miniaturization of a semiconductor device, recess portions such as trenches or the like have an increased aspect ratio. This makes it difficult to form a good quality ruthenium film on a $MnO_x$ film in the recess portions. Thus, due to an insufficient burying property of copper, there is a possibility that poor burying occurs.

SUMMARY

The present disclosure provides a method of forming copper wirings, which can secure a sufficient burying property of copper even in an extremely fine recess portion.

Through repeated investigations aimed at solving the above problems, the present inventors have found that if a metal such as tantalum (Ta) or the like that is more active than ruthenium is placed on the $MnO_x$ film that has been subjected to hydrogen radical treatment, the metal serves as a nucleation site of ruthenium, whereby a high quality ruthenium film can be formed thin and uniformly with a good step coverage even in a fine recess portion, thereby securing a good burying property of copper. As a result, the present inventors can complete the present disclosure.

According to an embodiment of the present disclosure, there is provided a method of forming a copper wiring buried in a recess portion of a predetermined pattern formed in an interlayer insulation layer of a substrate, the method comprising: forming a $MnO_x$ film at least on a surface of the recess portion, the $MnO_x$ film serving as a self-aligned barrier film through reaction with the interlayer insulation layer; performing hydrogen radical treatment with respect to a surface of the $MnO_x$ film; placing a metal more active than ruthenium on the surface of the $MnO_x$ film after the hydrogen radical treatment; forming a ruthenium film on the surface where the metal more active than ruthenium is present; and forming a copper film on the ruthenium film by physical vapor deposition (PVD) to bury the copper film in the recess portion.

According to another embodiment of the present disclosure, there is provided a non-transitory storage medium operating on a computer and storing a program for controlling a copper wiring forming system, wherein, when the program is executed, the program allows the computer to control the copper wiring forming system to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing a method of forming copper wirings according to one embodiment of the present disclosure.

FIGS. 2A to 2H show sectional views showing processes illustrating the method of forming copper wirings according to the one embodiment of the present disclosure.

FIGS. 3A and 3B show views illustrating a mechanism in which a $MnO_x$ film is formed in a trench to react with an underlying interlayer insulation layer to thereby forming a self-aligned barrier film.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, some embodiments of the present disclosure will be described in detail with reference to the accompanying drawings.

<One Embodiment of Method of Forming Copper Wirings>

First, one embodiment of a method of forming copper wirings according to the present disclosure will be described with reference to a flowchart of FIG. 1 and sectional views of FIG. 2.

Further, since manganese oxide may take various forms including $MnO$, $Mn_3O_4$, $Mn_2O_3$, and $MnO_2$, all of these oxides will be designated by $MnO_x$.

Figure 2A:
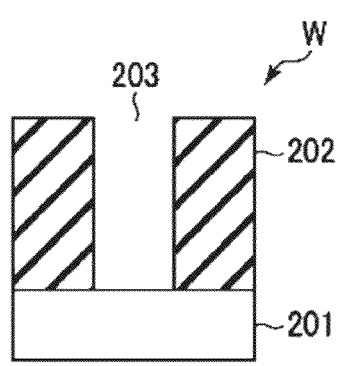

First, a semiconductor wafer (hereinafter, simply referred to as the "wafer") W is prepared (Step S1, see FIG. 2A). The wafer W includes an interlayer insulation layer 202 composed of a Si-containing layer such as a $SiO_2$ layer, a low dielectric (low-k) layer (SiCO, SiCOH, etc.) or the like, and disposed on a base structure 201 (details thereof are omitted herein) including a copper wiring underlayer, wherein a trench 203 and a via (not shown) for connecting to the copper wiring underlayer are formed in a predetermined pattern in the interlayer insulation layer.

Figure 2B:
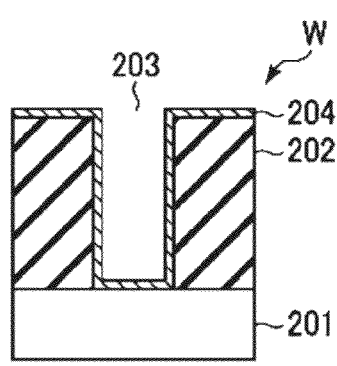

Thereafter, the wafer W is subjected to pre-processes such as degassing or pre-cleaning to remove moisture from a surface of the insulation layer (Step S2, not shown in FIGS. 2A to 2H), and then a $MnO_x$ film 204, which will serve as a barrier film for inhibiting diffusion of copper, is formed on an overall surface, including surfaces of the trench 203 and the via (Step S3, see FIG. 2B).

Figure 2C:
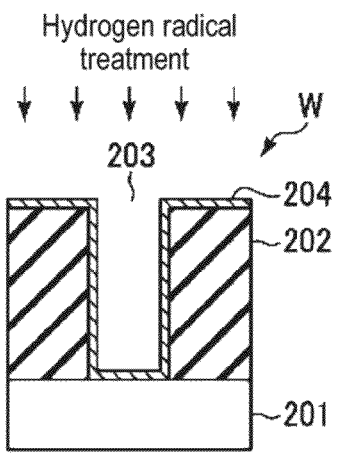
Figure 2D:
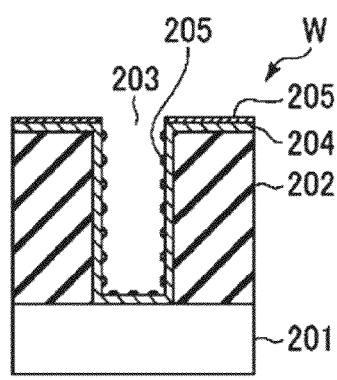

Thereafter, the $MnO_x$ film 204 is subjected to hydrogen radical treatment (Step S4, see FIG. 2C). This treatment is performed to reduce a surface of the $MnO_x$ film 204 to facilitate a process of forming a ruthenium film. Further, this treatment also serves to cause a part of the $MnO_x$ film 204 to be formed into silicate.

Thereafter, a process for placing a metal 205 more active than ruthenium on the surface of the $MnO_x$ film having been subjected to hydrogen radical treatment is performed (Step S5, see FIG. 2D), and a ruthenium film 206 is then formed as a liner film (Step S6, see FIG. 2E).

Thereafter, a copper film 207 is formed by PVD while copper is buried in the trench 203 and the via (not shown) (Step S7, see FIG. 2F). In this case, for a subsequent planarization process, the copper film 207 is preferably stacked from an upper surface of the trench 203 in some embodiments.

Thereafter, annealing is performed, as needed (Step S8, see FIG. 2G). This annealing stabilizes the copper film 207.

Then, the overall surface of the wafer W is subjected to chemical mechanical polishing (CMP) such that a stacked portion of the copper film 207, the ruthenium film 206, the metal more active than ruthenium, and the $MnO_x$ film 204 acting as a barrier film are all removed for planarization of the wafer (Step S9, see FIG. 2H). As a result, a copper wiring 208 is formed within the trench and the via (hole).

Furthermore, after forming the copper wiring 208, a suitable cap film such as a dielectric cap or a metal cap is formed on the overall surface of the wafer W including the copper wiring 208 and the interlayer insulation layer 202.

Hereinafter, among the above processes, main processes will be described in detail.

First, the process of forming the $MnO_x$ film 204, which is a barrier film, will be described.

The $MnO_x$ film 204 is formed by CVD or atomic layer deposition (ALD). By means of heat generated during the process of forming the $MnO_x$ film 204 or subsequent processes (e.g. hydrogen radical treatment, annealing, etc.), the $MnO_x$ film 204 reacts with silicon (Si) and oxygen (O) of the interlayer insulation layer 202 at least at a boundary portion with the interlayer insulation layer 202, whereby manganese silicate ($Mn_xSiO_y$ ($MnSiO_3$ or $Mn_2SiO_4$)) is formed to function as a self-aligned barrier film.

In other words, since the $MnO_x$ film 204 reacts with silicon and oxygen contained in the underlying interlayer insulation layer 202 as shown in FIG. 3A, the barrier film is formed on a side of the underlying interlayer insulation layer 202 as shown in FIG. 3B. This makes it possible for the barrier film within a recess portion such as a hole or a trench to have a smaller volume. The volume of the barrier film in the recess portion may approach zero. Thus, the volume of copper in the copper wiring can be increased to realize low resistance of the wiring. In some embodiments, the $MnO_x$ film 204 is desirably thin in order to increase the volume of copper in the wiring. Preferably, the $MnO_x$ film has a thickness of 3 nm or less.

In forming the $MnO_x$ film 204, a manganese compound gas and an oxygen-containing gas are used. In CVD, these gases are supplied into a processing chamber at the same time, whereas, in ALD, the gases are alternately supplied into the processing chamber, while purging the processing chamber between each gas supply.

As the manganese compound gas, cyclopentadienyl-based manganese compounds may be suitably used. An example of the cyclopentadienyl-based manganese compounds may include bis(alkyl cyclopentadienyl) manganese represented by chemical formula $Mn(RC_5H_4)_2$ such as $Cp_2Mn$ [$=Mn(C_5H_5)_2$], $(MeCp)_2Mn$ [$=Mn(CH_3C_5H_4)_2$], $(EtCp)_2Mn$ [$=Mn(C_2H_5C_5H_4)_2$], $(i-PrCp)_2Mn$ [$=Mn(C_3H_7C_5H_4)_2$], or $(t-BuCp)_2Mn$ [$=Mn(C_4H_9C_5H_4)_2$].

In addition, other examples of the manganese compound may include carbonyl-based manganese compounds, β-diketone-based manganese compounds, amidinate-based manganese compounds, and amideaminoalkane-based manganese compounds.

Examples of carbonyl-based manganese compounds may include decacarbonyl dimanganese ($Mn_2(CO)_{10}$) and methylcyclopentadienyl tricarbonyl manganese (($CH_3C_5H_4$)Mn $(CO)_3$). Among these, specifically, ($Mn_2(CO)_{10}$) has a simple structure, so that it may be expected to form a Mn film with low impurities.

Examples of amidinate-based manganese compounds may include bis(N,N'-dialkyl aceteamidinate) manganese expressed by a chemical formula $Mn(R^1N\text{—}CR^3\text{—}NR^2)_2$, which is disclosed in US Patent Application Publication No. US2009/0263965A1.

Examples of amideaminoalkane-based manganese compounds may include bis(N,N'-1-alkylamide-2-dialkylamino alkane) manganese expressed by a chemical formula $Mn(R^1N\text{—}Z\text{—}NR^2_2)_2$, which is disclosed in International Publication No. 2012/060428. In this formula, "R, $R^1$, $R^2$, $R^3$" are functional groups having formula —$C_nH_{2n+1}$ (n being an integer not less than 0) and "Z" is a functional group having formula —$C_nH_{2n}$— (n being an integer not less than 1).

In addition, examples of the oxygen-containing gas may include $H_2O$ (water vapor), $N_2O$, $NO_2$, NO, $O_3$, $O_2$, $H_2O_2$, CO, $CO_2$, and alcohols such as methyl alcohol or ethyl alcohol.

A film forming temperature (wafer temperature) may preferably range from 100 degrees C. to 400 degrees C. in some embodiments. Further, while the film is being formed, a pressure within the processing chamber preferably ranges from 1.33 Pa to 133 Pa.

Alternatively, the $MnO_x$ film may be formed by a method disclosed in Japanese Patent Application Publication No. 2010-242187. In other words, the $MnO_x$ film is formed at a temperature ranging from 100 degrees C. to less than 400 degrees C. using the cyclopentadienyl-based manganese compound as the manganese compound gas. Here, oxygen, which oxidizes manganese, is supplied from the underlying interlayer insulation layer 202. In addition, oxygen from the interlayer insulation layer 202 includes oxygen originating from moisture contained in the interlayer insulation layer 202 (physically adsorbed water and chemically adsorbed water).

Next, hydrogen radical treatment will be described.

Hydrogen radical treatment is performed to reduce the $MnO_x$ film 204, so that the surface of the film is reformed to manganese. This makes it easier to form the ruthenium film. In other words, with hydrogen radical treatment, an incubation time can be shortened while the ruthenium film is being formed, thereby increasing a film forming rate. Further, the ruthenium film can be formed thin and uniformly with high step coverage while the quality of the ruthenium film is improved (low resistance).

When $MnO_x$ is exposed to the surrounding atmosphere after forming the $MnO_x$ film, it is desirable that the processing chamber for hydrogen radical treatment is subjected to degassing.

Hydrogen radical treatment may be carried out by any suitable method so long as hydrogen radicals (atomic hydrogen) can be produced. For example, a remote plasma process, a plasma process, and a process of bringing hydrogen gas into contact with a heating filament may be employed.

In a remote plasma process, after generating hydrogen plasma with inductively coupled plasma or microwave plasma outside a processing chamber, the hydrogen plasma is supplied into the processing chamber, so that the process is performed by hydrogen radicals contained in the processing chamber.

In the plasma process, capacitively coupled plasma or inductively coupled plasma is generated within a processing chamber and the process is performed by hydrogen radicals in hydrogen plasma thus produced in the processing chamber.

In process of bringing hydrogen gas into contact with a heating filament, the heating filament serves as a catalyst, thereby generating hydrogen radicals through a catalytic cracking reaction.

As a gas supplied for the hydrogen radical treatment, a mixture of hydrogen gas and an inert gas such as argon gas is preferably used. At this time, the concentration of hydrogen preferably ranges from 1% to 50% in the mixture in some embodiments. One example is 10% of hydrogen and 90% of argon. In addition, the wafer temperature preferably ranges from room temperature to 450 degrees C., more preferably from 200 degrees C. to 400 degrees C. The processing pressure preferably ranges from 10 Pa to 500 Pa, more preferably from 20 Pa to 100 Pa.

Next, the process of placing the metal 205 more active than ruthenium on the surface of the $MnO_x$ film having been subjected to the hydrogen radical treatment will be described.

This process serves to complement the hydrogen radical treatment at Step S4. Although the hydrogen radical treatment facilitates the process of forming the ruthenium film, such an effect may not be sufficiently obtained in case of a fine trench or hole. However, the process in Step S5 enables a high quality thin ruthenium film to be uniformly formed with high step coverage even in the fine trench or hole. As a result, subsequent copper burying can be effectively achieved.

Figure 4:
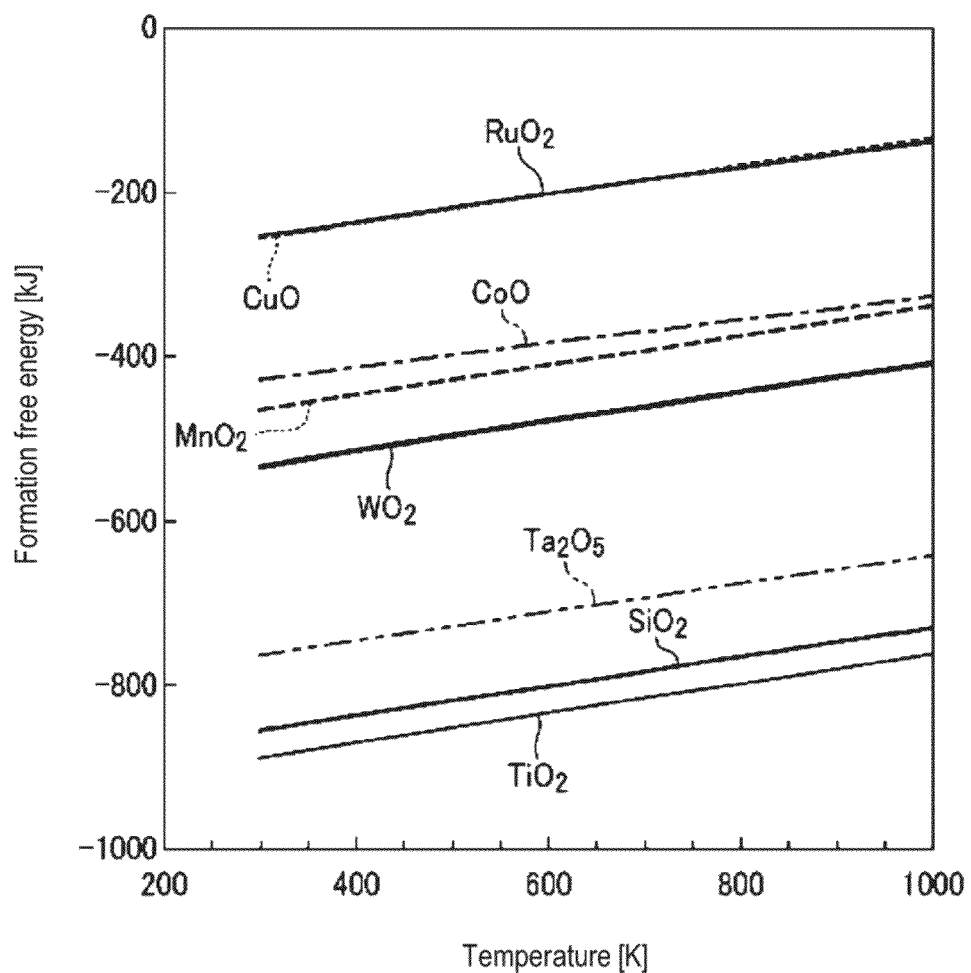
FIG. 4 is a graph representing a metal oxide generation free energy.

FIG. 4 is a graph representing a metal oxide generation free energy, where, when the free energy is a lower value (a greater absolute value as a negative value), the metal is more active. As shown in FIG. 4, examples of a metal more active than ruthenium may include tantalum (Ta), cobalt (Co), tungsten (W), titanium (Ti), and the like. Among these metals, Ta, which has been traditionally used as a barrier film, is preferably used in some embodiments.

As described above, if the metal 205 more active than ruthenium is placed on the surface of the $MnO_x$ film that has been subjected to hydrogen radical treatment, the metal 205 contributes to the nucleation of ruthenium when forming the ruthenium film. Thus, a high quality thin ruthenium film can uniformly be formed with high step coverage even in a fine trench or via (hole).

The metal 205 more active than ruthenium only has to contribute to the nucleation of ruthenium and is not necessary to be present in the form of a continuous film. In other words, the metal 205 may be present in a discontinuous form so long as the metal can contribute to the nucleation of ruthenium.

The process of placing the metal 205 more active than ruthenium is not particularly restricted, and may suitably employ a method of depositing a metal through physical vapor deposition (PVD). As a PVD, iPVD (ionized physical vapor deposition), for example, plasma sputtering, may be suitably used. In this case, the metal film is preferably formed to an average thickness of 1 nm to 5 nm at a field region where the trench is not formed. As a result, although the metal is discontinuously formed within the fine trench or the via (hole), the metal can sufficiently contribute to the nucleation of ruthenium. In this process, since it is just needed to place an amount of metal capable of contributing to the nucleation of ruthenium within the fine trench or the via (hole), the metal may hardly affect the volume of a buried copper film. It is also allowed that the metal may be formed into a continuous film within the trench or the via (hole).

Next, the process of forming the ruthenium film 206 as a liner film will be described.

Since ruthenium has high wettability to copper, the ruthenium film is formed as an underlying film of copper to thereby securing good mobility of copper when the copper film is formed by PVD. This makes it difficult for an overhang to be produced, which causes a blockage of an opening of the trench or the hole. However, even though the ruthenium film is formed on the $MnO_x$ film, it is difficult to form a high quality ruthenium film with high step coverage due to low nucleation density of ruthenium. Thus, as described above, in addition to the hydrogen radical treatment, the process of placing the metal more active than ruthenium on the surface of the $MnO_x$ film 204 is performed, so that the metal serves as a nucleation site of ruthenium to allow a high quality ruthenium film with high step coverage to form, whereby a thin uniform ruthenium film can be formed. Accordingly, copper can be surely buried in the fine trench or via (hole) without generating voids. It is desirable in some embodiments that the ruthenium film be formed to have a thin thickness, for example, a thickness of 1 nm to 5 nm, in order to increase the volume of buried copper to reduce resistance of the wiring. In this embodiment, such a thin ruthenium film can be uniformly formed even in the fine trench or via (hole).

The ruthenium film 206 may be suitably formed using ruthenium carbonyl ($Ru_3(CO)_{12}$) as a film material by thermal chemical vapor deposition (CVD). As a result, a high purity thin ruthenium film with high step coverage can be formed. Herein, for example, a pressure within the processing chamber among the film formation conditions ranges from 1.3 Pa to 66.5 Pa, and a film formation temperature (wafer temperature) ranges 150 degrees C. to 250 degrees C. The ruthenium film 206 may be formed by CVD using a film material other than ruthenium carbonyl, for example, pentadienyl compounds of ruthenium, such as (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyl)ruthenium, and bis(2,4-methylpentadienyl)(ethylcyclopentadienyl)ruthenium. Alternatively, the ruthenium film may be formed by PVD. However, CVD is desirable in terms of good step coverage.

Next, the process of forming the copper film 207 will be described.

The copper film 207 is formed by PVD, which is a dry process. Preferably, the aforementioned iPVD, for example, plasma sputtering, is employed. Further, the stacked portion of the copper film may be formed by plating, instead of consecutively performing PVD to form the copper film.

When copper is buried by a typical PVD film formation process, an overhang, which blocks an opening of the trench or the hole, is likely to be formed due to agglomeration of copper. However, in iPVD, the formation of the overhang can be suppressed by migrating copper by adjusting the bias power applied to the wafer and controlling the film formation of copper ions and etching by ions (Ar ions) of a plasma-generating gas, so that copper can be effectively buried even in a trench or a hole having a narrow opening. Here, a high temperature process (at 65 degrees C. to 350 degrees C.) for migrating copper is desirable in terms of good burying property of copper by securing fluidity of copper. Forming a film using PVD at high temperature enables a crystal grain of copper to grow and grain boundary scattering to be low, thereby reducing resistance of the copper wiring. In addition, as described above, since a high quality ruthenium film 206 with high wettability to copper can be formed thin and uniform under the copper film 207, copper can flow on the ruthenium film without being agglomerated and the overhang can be suppressed even in a fine recess portion, so that copper can surely be buried without generating voids.

In forming the copper film, a pressure in the processing chamber (process pressure) preferably ranges from 1 mTorr to 100 mTorr (from 0.133 Pa to 13.3 Pa), more preferably from 35 mTorr to 90 mTorr (from 4.66 Pa to 12.0 Pa).

As discussed above, according to this embodiment, the $MnO_x$ film 204 is formed to be thin as a self-aligned barrier, and the surface of the $MnO_x$ film is subjected to hydrogen radical treatment to reduce the surface of the $MnO_x$ film, and then the metal 205, such as tantalum (Ta) or the like, which is more active than ruthenium, is placed on the reduced surface, so that a high quality ruthenium film can be formed thin and uniformly even in the fine trench or via (hole). As a result, good burying property of copper can be secured.

In addition, since the $MnO_x$ film is used as a barrier film, it can be formed thin as a thin self-aligned barrier. In addition, it is allowed that the metal 205, such as tantalum or the like, which are formed on the surface of the $MnO_x$ film may be discontinuous. Further, since the ruthenium film may be formed thin and uniform, it is possible to maximize the volume of copper in a recess portion such as a trench or a hole. Further, since copper is buried by PVD which is a dry film formation process, it is possible to increase a grain size of copper, thereby reducing the grain boundary scattering. In this way, since the volume of the buried copper can be maximized and the grain boundary scattering can be low, it is possible to reduce resistance of the copper wiring.

Hereinafter, an experiment verifying the effect of this embodiment will be described.

In this experiment, a low-k film (SiCOH-based; k=2.55) was used as an interlayer insulation layer, and Sample A (Example according to the present disclosure), in which the surface of the low-k film was subjected to the following processes: ALD $MnO_x$ film formation, hydrogen radical treatment, iPVD Ta film formation, CVD Ru film formation, iPVD Cu burying, and Sample B (Comparative Example), in which the surface of the low-k film was subjected to the following processes: ALD $MnO_x$ film formation, hydrogen radical treatment, CVD Ru film formation, iPVD copper burying were evaluated as to burying characteristics of copper. In addition, a wiring width is set to a thickness of 70 nm.

Further, general conditions for each of the processes are as follows.

(1) $MnO_x$ film formation by ALD
    Pressure: 1.33 Pa
    Wafer temperature: 130 degrees C.
    ALD cycles: 21 cycles (2) Hydrogen radical treatment
    RF supply power: 2 kW
    Hydrogen concentration: 10%
    Pressure: 32 Pa
    Temperature: 300 degrees C.

(3) iPVD Ta film formation
    Power supplied to IPC coil: 5.25 kW
    DC power to target: 2.3 kW
    RF bias (13.56 MHz) applied to mounting table: 200 W
    Pressure: 87 Pa (4) CVD ruthenium film formation
    Pressure: 66.5 Pa
    Temperature: 200 degrees C.

(5) iPVD copper film formation (copper burying)
    Power supplied to IPC coil: 4 kW
    DC power to target: 11 kW
    RF bias (13.56 MHz) applied to mounting table: 400 W
    Pressure: 12 Pa
    Temperature: 300 degrees C.

Figure 5:
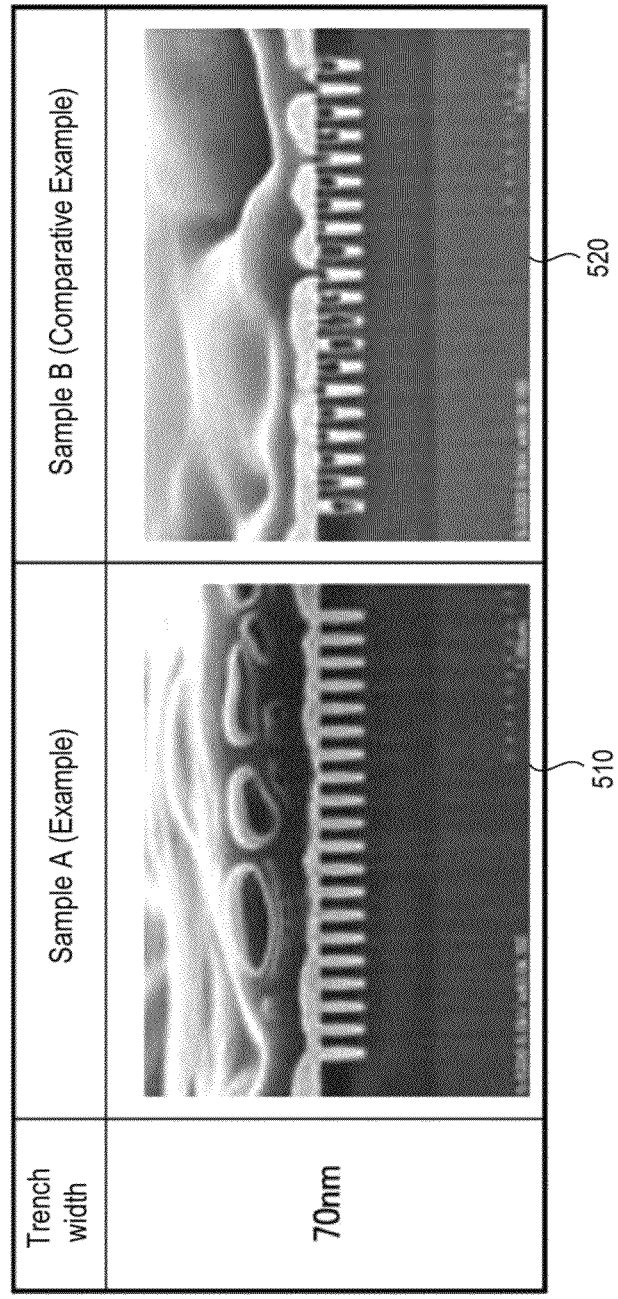
FIG. 5 is SEM images showing a cross section of a sample A which is an example of the present disclosure and a cross section of a sample B which is a comparative example.
Figure 6:
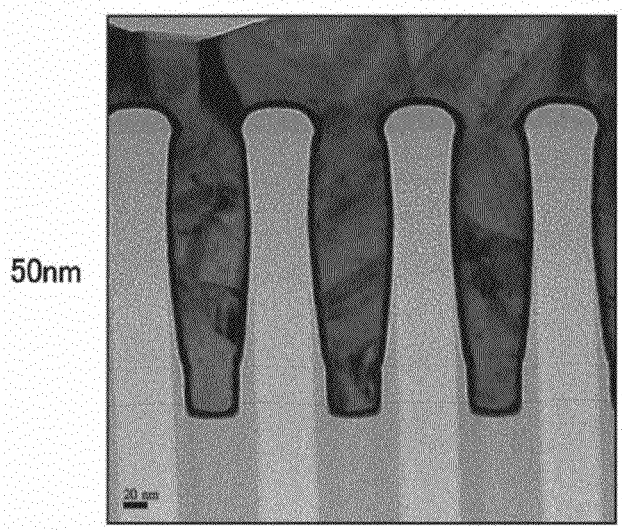
FIG. 6 is a TEM image showing a cross section of a sample A.

Results are shown in FIG. 5. In FIG. 5, a left image 510 is a scanning electron microscope (SEM) image showing a cross section of Sample A, and a right image 520 is an SEM image showing a cross section of Sample B. FIG. 6 is a transmission electron microscope (TEM) image showing a cross section of the sample according to the present disclosure with a wiring width of 50 nm in more detail. As shown in these images, while copper was insufficiently buried according to the sample of Comparative Example, it was verified that, in the sample according to the present disclosure, copper could be fully buried without generating voids.

Figure 7:
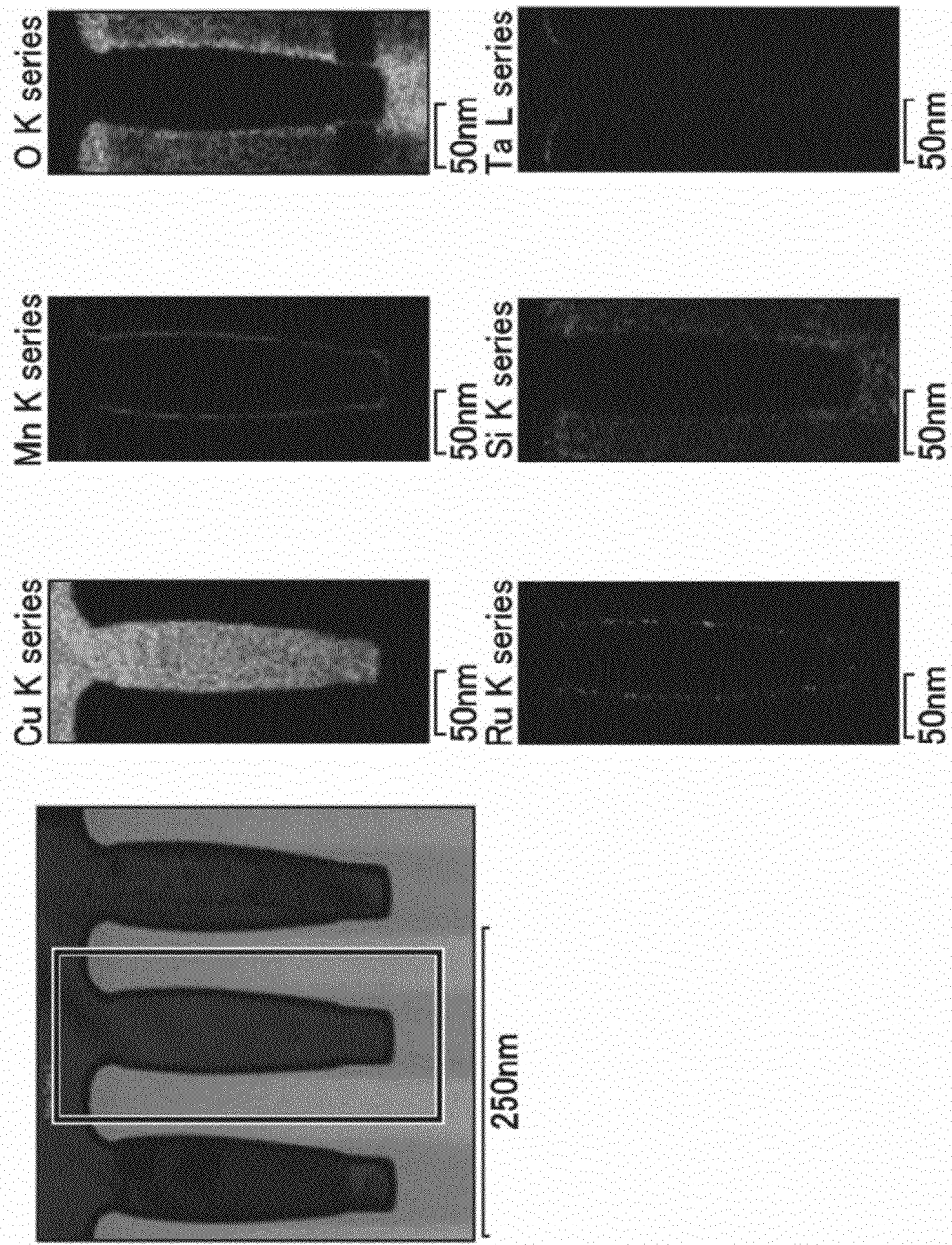
FIG. 7 shows views of element mapping results of a copper-buried portion of a sample A using an energy dispersive X-ray spectrometer (EDX).

Thereafter, for a copper-buried portion of the sample according to the present disclosure, an element mapping was performed using an energy dispersive X-ray spectrometer (EDX) attached to a TEM. Results are shown in FIG. 7. Here, an area surrounded by a rectangle on the left in FIG. 7 is a mapping area. As shown in FIG. 7, it can be seen that, although tantalum is present in a field region, tantalum is barely present on sidewalls of a trench. In other words, tantalum has little influence on the volume of the copper film.

<Film Formation System Suitable for Embodiment of the Present Disclosure>

Figure 8:
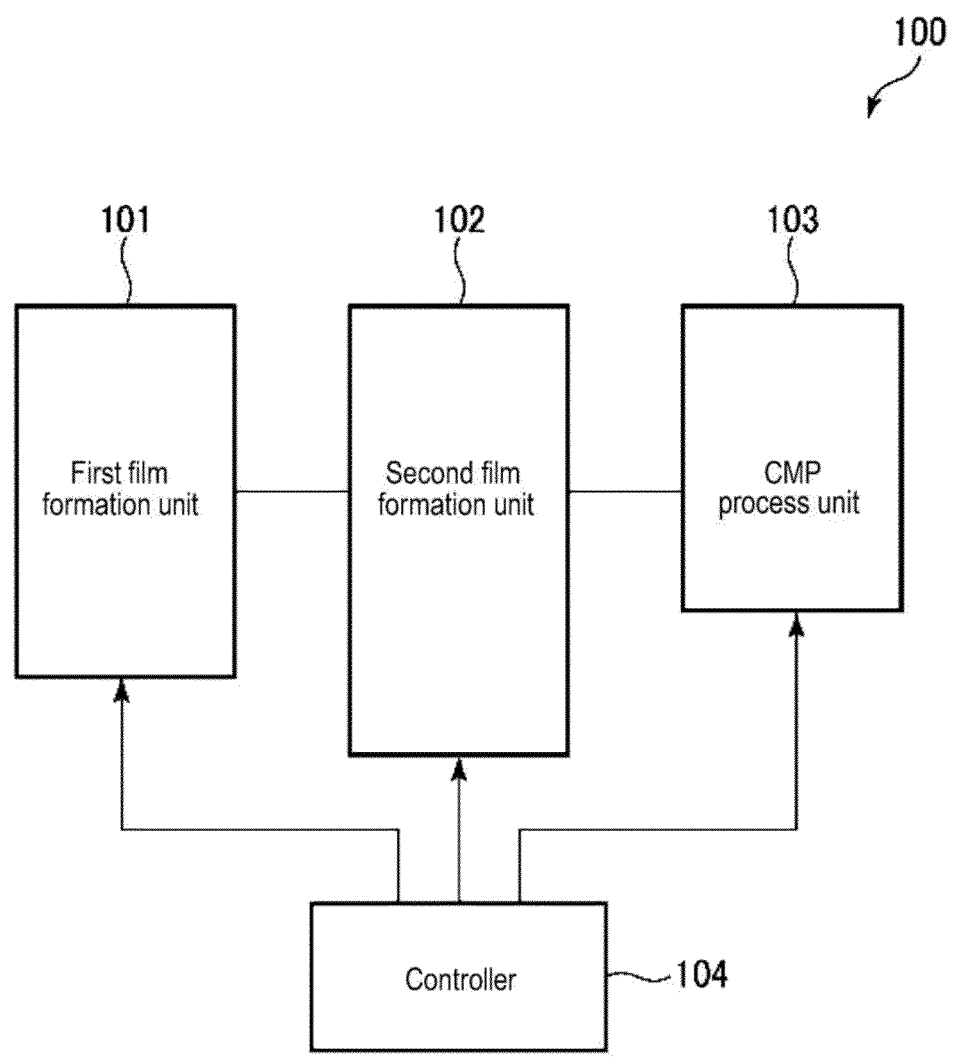
FIG. 8 is a schematic block diagram showing a system suitable for performing a method of forming a copper wiring according to an embodiment of the present disclosure.
Figure 10:
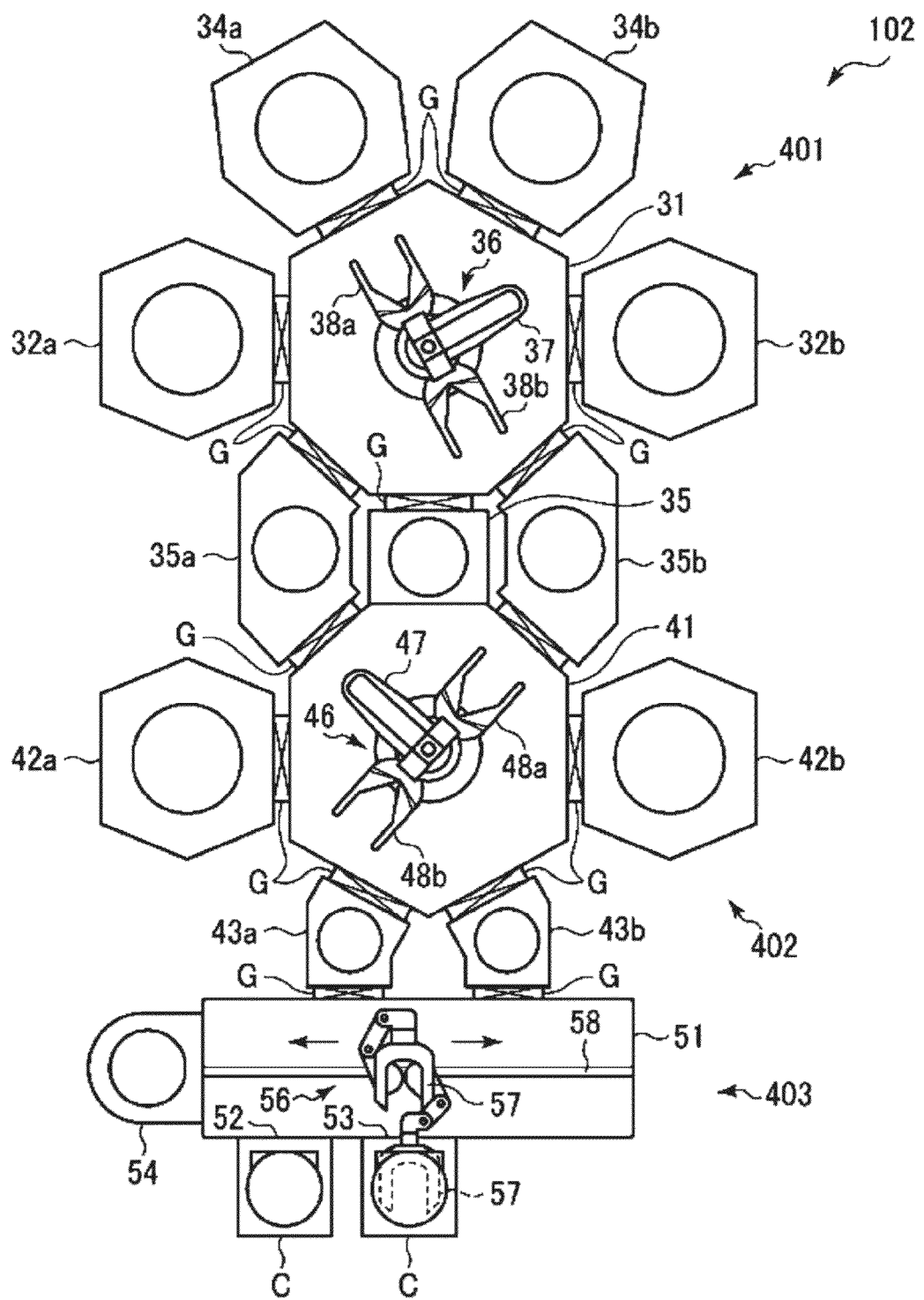
FIG. 10 is a plan view showing a second film formation unit shown in FIG. 8.
Figure 11:
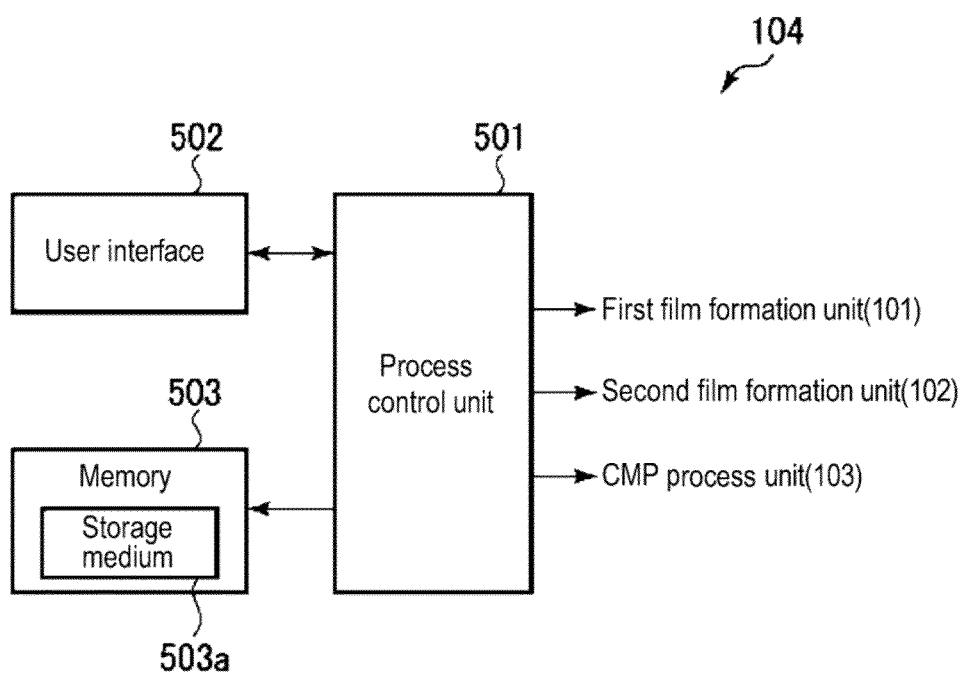
FIG. 11 is a block diagram showing a controller show in FIG. 8.

Hereinafter, a film formation system suitable for a method of forming a copper wiring according to an embodiment of the present disclosure will be described. FIG. 8 is a schematic block diagram showing a film formation system suitable for performing a method of forming a copper wiring according to an embodiment of the present disclosure, FIG. 9 is a plan view showing an example of a first film formation unit in FIG. 8, FIG. 10 is a plan view showing a second film formation unit in FIG. 8, FIG. 11 is a block diagram showing a controller in FIG. 8.

As shown in FIG. 8, the film formation system 100 includes a first film formation unit 101 configured to perform degassing and forming an $MnO_x$ film which is a barrier film; a second film formation unit 102 configured to perform degassing, performing hydrogen radical treatment, tantalum formation, forming a ruthenium film, and forming a copper film; a chemical mechanical polishing (CMP) process unit 103 configured to perform a CMP process; and a controller 104 configured to control each component of the film formation system 100.

Figure 9:
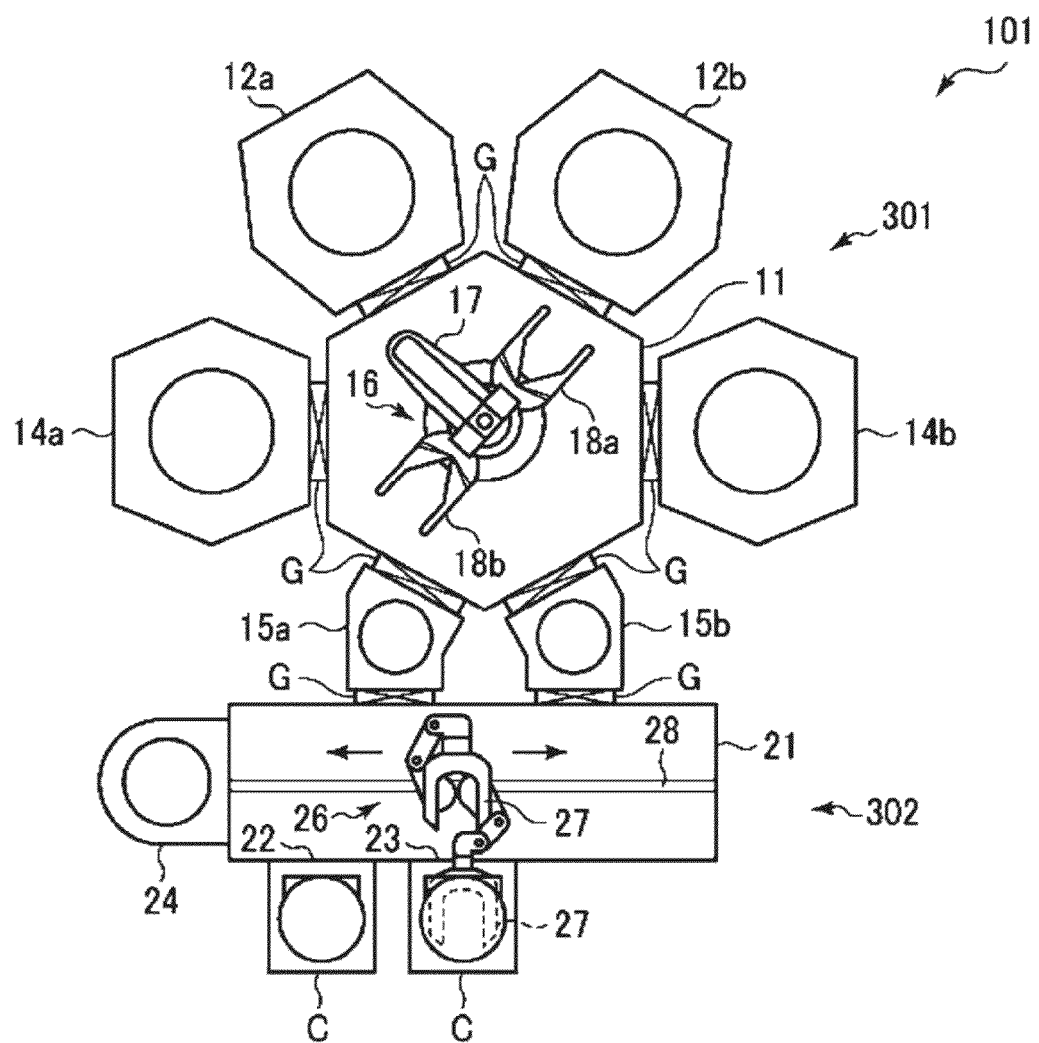
FIG. 9 is a plan view showing an example of a first film formation unit shown in FIG. 8.

As shown in FIG. 9, the first film formation unit 101 includes a $MnO_x$ film formation section 301 and a loading/unloading section 302.

The $MnO_x$ film formation section 301 includes a vacuum transfer chamber 11, and two degassing devices 12a and 12b and two $MnO_x$ film formation devices 14a and 14b, all of which are connected to a wall portion of the vacuum transfer chamber 11. The degassing device 12a and the $MnO_x$ film formation device 14a are disposed in line symmetry with respect to the degassing device 12b and the $MnO_x$ film formation device 14b. In addition, load lock chambers 15a and 15b capable of performing an atmospheric transfer and a vacuum transfer are connected to two wall portions toward a side of the loading/unloading section 302, respectively.

The degassing devices 12a and 12b, the $MnO_x$ film formation devices 14a and 14b, and the load lock chambers 15a and 15b are connected to each wall portion of the vacuum transfer chamber 11 through gate valves G, and are communicated with the vacuum transfer chamber 11 by opening the corresponding gate valve G and are isolated from the vacuum transfer chamber 11 by closing the corresponding gate valve G.

The vacuum transfer chamber 11 is maintained in a predetermined vacuum atmosphere, and provided with a transfer mechanism 16 configured to perform loading/unloading of wafers into or from the degassing devices 12a and 12b, the $MnO_x$ film formation devices 14a and 14b, and the load lock chambers 15a and 15b. The transfer mechanism 16 is disposed at an approximate center of the vacuum transfer chamber 11, and has a rotatable and extensible rotation and extension portion 17 which is provided at a tip end of the transfer mechanism 16 with two support arms 18a and 18b configured to support a wafer W, wherein two support arms 18a and 18b are installed on the rotation and extension portion 17 to face in an opposite direction to each other.

The loading/unloading section 302 is disposed opposite from the $MnO_x$ film formation section 301, with the load lock chambers 15a and 15b interposed between the loading/unloading section 302 and the $MnO_x$ film formation section 301, and includes an atmospheric transfer chamber 21, to which the load lock chambers 15a and 15b are connected. A filter (not shown) is provided at an upper portion of the atmospheric transfer chamber 21 and is configured to create a down flow of clean air. Gate valves G are disposed at a wall portion between the load lock chambers 15a and 15b and the atmospheric transfer chamber 21. Two connection ports 22 and 23 for connecting carriers C accommodating wafers W as substrates to be processed are disposed at a wall portion of the atmospheric transfer chamber 21, which faces the wall portion to which the load lock chambers 15a and 15b are connected. In addition, an alignment chamber 24 is provided at a side surface of the atmospheric transfer 21 and is configured to perform alignment of wafers W. The atmospheric transfer chamber 21 is provided with a transfer mechanism 26 for the atmospheric transfer, which is configured to perform loading/unloading of wafers W into or from the carriers C and loading/unloading of wafers W into or from the load lock chambers 15a and 15b. The transfer mechanism 26 for the atmospheric transfer has two multi joint arms, and is configured to be able to move along a rail 28 in an arrangement direction of the carriers C, so that wafers W are transferred while the wafers W are placed on hands 27 at tip ends of the respective arms.

As shown in FIG. 10, the second film formation unit 102 has a first process section 401 for forming a tantalum film and forming a ruthenium film, a second process section 402 for forming a copper film, and a loading/unloading section 403.

The first process section 401 has a first vacuum transfer chamber 31, and two tantalum formation devices 32a and 32b and two ruthenium film formation devices 34a and 34b, all of which are connected to wall portions of the first vacuum transfer chamber 31. The tantalum formation device 32a and the ruthenium film formation device 34a are disposed in line symmetry with respect to the tantalum formation device 32b and the ruthenium film formation device 34b. Alternatively, instead of the tantalum formation device, a device for forming another metal more active than ruthenium, for example, cobalt, tungsten, titanium or the like may be used.

Hydrogen radical treatment devices 35a and 35b, which are configured to perform hydrogen radical treatment with respect to a wafer W, are connected to the other wall portions of the first vacuum transfer chamber 31. The hydrogen radical treatment devices 35a and 35b are also configured to perform degassing of the wafer W. In addition, a transfer chamber 35 for transferring wafers W between the first vacuum transfer chamber 31 and a second vacuum transfer chamber 41 described later is connected to a wall portion of the first vacuum transfer chamber 31 between hydrogen radical treatment devices 35a and 35b.

The tantalum formation devices 32a and 32b, the ruthenium film formation devices 34a and 34b, the hydrogen radical treatment devices 35a and 35b, and the transfer chamber 35 are connected to each side of the first vacuum transfer chamber 31 through gate valves G, and are communicated with the first vacuum transfer chamber 31 by opening the corresponding gate valve G and are isolated from the first vacuum transfer chamber 31 by closing the corresponding gate valve G.

The first vacuum transfer chamber 31 is maintained in a predetermined vacuum atmosphere, and provided with a first transfer mechanism 36 configured to transfer wafers W. The first transfer mechanism 36 is disposed at an approximate center of a first vacuum transfer chamber 31, and has a rotatable and extensible rotation and extension portion 37 which is provided at a tip end of the first transfer mechanism 36 with two support arms 38a and 38b configured to support wafers W. The first transfer mechanism 36 performs loading/unloading of wafers W into or from the tantalum formation devices 32a and 32b, the ruthenium film formation devices 34a and 34b, the hydrogen radical treatment devices 35a and 35b, and the transfer chamber 35.

The second treatment section 402 has a second vacuum transfer chamber 41 and two copper film formation devices 42a and 42b which are connected to opposite wall portions of the second vacuum transfer chamber 41. The copper film formation devices 42a and 42b may be used in a batch process for burying in a recess portion and forming a stacked portion. Alternatively, the copper film formation devices 42a and 42b may be used only fur burying, and the stacked portion may be formed by plating.

The hydrogen radical treatment devices 35a and 35b are connected to two wall portions of the second vacuum transfer chamber 41 toward a side of the first treatment section 401, respectively, and the transfer chamber 35 is connected to a wall portion of the second vacuum transfer chamber 41 between the hydrogen radical treatment devices 35a and 35b. In other words, the transfer chamber 35 and the hydrogen radical treatment devices 35a and 35b are all disposed between the first vacuum transfer chamber 31 and the second vacuum transfer chamber 41, and the hydrogen radical treatment devices 35a and 35b are placed on both sides of the transfer chamber 35. In addition, load lock chambers 43a and 43b capable of performing the atmospheric transfer and the vacuum transfer are connected to two wall portions toward a side of the loading/unloading section 403, respectively.

The copper film formation devices 42a and 42b, the hydrogen radical treatment devices 35a and 35b, and the load lock chambers 43a and 43b are connected to each wall portion of the second vacuum transfer chamber 41 through gate valves G, and are communicated with the second vacuum transfer chamber 41 by opening the corresponding gate valve G and are isolated from the second vacuum transfer chamber 41 by closing the corresponding gate valve G. In addition, the transfer chamber 35 is connected to the second vacuum transfer chamber 41 not through the gate valve G.

The second vacuum transfer chamber 41 is maintained at a predetermined vacuum atmosphere, and provided with a second transfer mechanism 46 configured to perform loading/unloading of wafers W into or from the copper film formation devices 42a and 42b, the hydrogen radical treatment devices 35a and 35b, the load lock chambers 43a and 43b, and the transfer chamber 35. The second transfer mechanism 46 is disposed at an approximate center of the second vacuum transfer chamber 41, and has a rotatable and extensible rotation and extension portion 47 which is provided at a tip end of the second transfer mechanism 46 with two support arms 48a and 48b configured to support wafers W, and the two support arms 48a and 48b are installed on the rotation and extension portion 47 to face in an opposite direction to each other.

The loading/unloading section 403 is disposed opposite the second treatment section 402, with the load lock chambers 43a and 43b interposed between the second treatment section 402 and the loading/unloading section 403, and has an atmospheric transfer chamber 51, to which the load lock chambers 43a and 43b are connected. The atmospheric transfer chamber 51 is provided at an upper portion with a filter (not shown) configured to create a down flow of clean air. Gate valves G are disposed at a wall portion between the load lock chambers 43a and 43b and the atmospheric transfer chamber 51. Two connection ports 52 and 53 for connecting the carriers C accommodating wafers W as substrates to be processed are disposed at a wall portion of the atmospheric transfer chamber 51, which faces the wall portion to which the load lock chambers 43a and 43b are connected. In addition, an alignment chamber 54 is provided at a side surface of the atmospheric transfer chamber 51 and is configured to perform alignment of wafers W. The atmospheric transfer chamber 51 is provided with a transfer mechanism 56 for atmospheric transfer, which is configured to perform loading/unloading of wafers W into or from the carriers C and loading/unloading of wafers W into or from the load lock chambers 43a and 43b. The transfer mechanism 56 for the atmospheric transfer has two multi-joint arms, and is configured to be able to move along a rail 58 in an arrangement direction of the carriers C, so that wafers W are transferred while the wafers W are placed on hands 57 at tip ends of the respective arms.

The CMP process unit 103 is composed of a CMP device and a transfer device attached to the CMP device.

As shown in FIG. 11, the controller 104 has a process control unit 501 composed of a microprocessor (computer) executing controls on each component of the first film formation unit 101, the second film formation unit 102, and the CMP process unit 103; a user interface 502 composed of a keyboard, by which an operator may input commands and the like to manage the film formation system 100, or a display which visually displays an operation state of the film formation system 100; and a memory 503 storing, for example, a control program which realizes processes performed by the film formation system 100 under control of the process control unit 501, or a program which allows each component of the process units to function according to various data and process conditions, i.e. a process recipe. In addition, the user interface 502 and the memory 503 are connected to the process control unit 501.

The recipe is stored in a storage medium 503a of the memory 503. Examples of the storage medium may include a hard disk and a transportable storage medium, such as CDROMs, DVDs, flash memories, etc. Alternatively, the recipe may be suitably sent via a leased line from another device.

If necessary, an arbitrary recipe is called from the memory 503 by instructions through the user interface 502 and then executed at the process control unit 501, so that a desired process in the film formation system 100 is performed under control of the process control unit 501.

In this film formation system 100, after etching and ashing are performed, the carrier C accommodating a wafer is transferred to the first film formation unit 101 and then set at a predetermined location. Thereafter, the wafer with a predetermined pattern having a recess portion, such as a trench or a via, is extracted from the carrier by the transfer mechanism 26 for the atmospheric transfer, and then transferred into the load lock chamber 15a or 15b. After decompressing the load lock chamber 15a or 15b to a vacuum level equal to that of the vacuum transfer chamber 11, the wafer W is extracted from the load lock chamber 15a or 15b by the transfer mechanism 16, and transferred into the degassing device 12a or 12b through the vacuum transfer chamber 11, and then subjected to degassing. Thereafter, the wafer W is extracted from the degassing device 12a or 12b by the transfer mechanism 16, and loaded into the $MnO_x$ film formation device 14a or 14b through the vacuum transfer chamber 11, and then a $MnO_x$ film for forming a self-aligned barrier film is formed as described above.

After forming the MnO$_x$ film, the wafer W is transferred into the load lock chamber 15a or 15b, and then the pressure of the load lock chamber 15a or 15b returns to atmospheric pressure. Thereafter, the wafer W with the MnO$_x$ film is extracted and returns to the carrier C by the transfer mechanism 26 for atmospheric transfer. This procedure is repeated as many times depending on the number of wafers W within the carrier C.

The carrier C accommodating the wafer with the MnO$_x$ film formed is transferred to the second film formation unit 102 and then set at a predetermined location. Thereafter, the wafer W with a predetermined pattern having a recess portion, such as a trench or a via, is extracted and then transferred into the load lock chamber 43a or 43b by the transfer mechanism 56 for the atmospheric transfer. After decompressing the load lock chamber 43a or 43b to a vacuum level equal to that of the second vacuum transfer chamber 41, the wafer W is extracted from the load lock chamber 43a or 43b and transferred into the hydrogen radical treatment device 35a or 35b through the second vacuum transfer chamber 41 by the second transfer mechanism 46, and, after performing the degassing, hydrogen radical treatment is subsequently performed. Thereafter, the wafer W is extracted from the hydrogen radical treatment device 35a or 35b and loaded into the tantalum formation device 32a or 32b through the first vacuum transfer chamber 31 by the first transfer mechanism 36, and then a tantalum forming process is performed for placing Ta, i.e., a metal more active than ruthenium, on the surface of the MnO$_x$ film. After forming Ta, the wafer W is extracted from the tantalum formation device 32a or 32b and loaded into the ruthenium film formation device 34a or 34b by the first transfer mechanism 36, and then a ruthenium film is formed as a liner film, as described above. After forming the ruthenium film, the wafer W is extracted from the ruthenium film formation device 34a or 34b and transferred into the transfer chamber 35 by the first transfer mechanism 36. Thereafter, the wafer W is extracted and loaded into the copper film formation device 42a or 42b through the second vacuum transfer chamber 41 by the second transfer mechanism 46, and then copper film is formed to bury copper in the recess portion such as a trench or a via. Here, although a stacked portion of the copper film may be formed in a batch, the copper film formation device 42a or 42b may be used only to bury copper in the recess portion, and the stacked portion of the copper film may be formed by plating.

After forming the copper film, the wafer W is transferred into the load lock chamber 43a or 43b and the pressure of the load lock chamber 43a or 43b returns to atmospheric pressure. Thereafter, the wafer W with the copper film formed is extracted and returns to the carrier C by the transfer mechanism 56 for the atmospheric transfer. This procedure is repeated as many times depending on the number of wafers W within the carrier C. In addition, if necessary, the wafer may be subjected to an annealing process using a suitable device, such as the copper film formation devices 42a and 42b or the hydrogen radical treatment devices 35a and 35b.

Thereafter, the carrier C accommodating the wafers after the aforementioned film formation process is completed is transferred to the CMP process unit 103, and then a CMP process is performed.

In the film formation system 100, the overall processes from the MnO$_x$ film formation to the CMP process may be carried out in a batch with respect to wafers after etching/ashing. In addition, in the second film formation unit 102, after forming the MnO$_x$ film, performing the hydrogen radical treatment, forming tantalum, forming the ruthenium film, and forming the copper film are performed upon the wafers under vacuum without being exposed to the atmosphere, so that it is possible to prevent oxidation of the films during these processes. Thus, copper wirings of high performance can be fabricated.

In addition, when the stacked portion of the copper film is formed by copper plating, the wafers are unloaded after the copper film is formed.

[PVD System]

Figure 12:
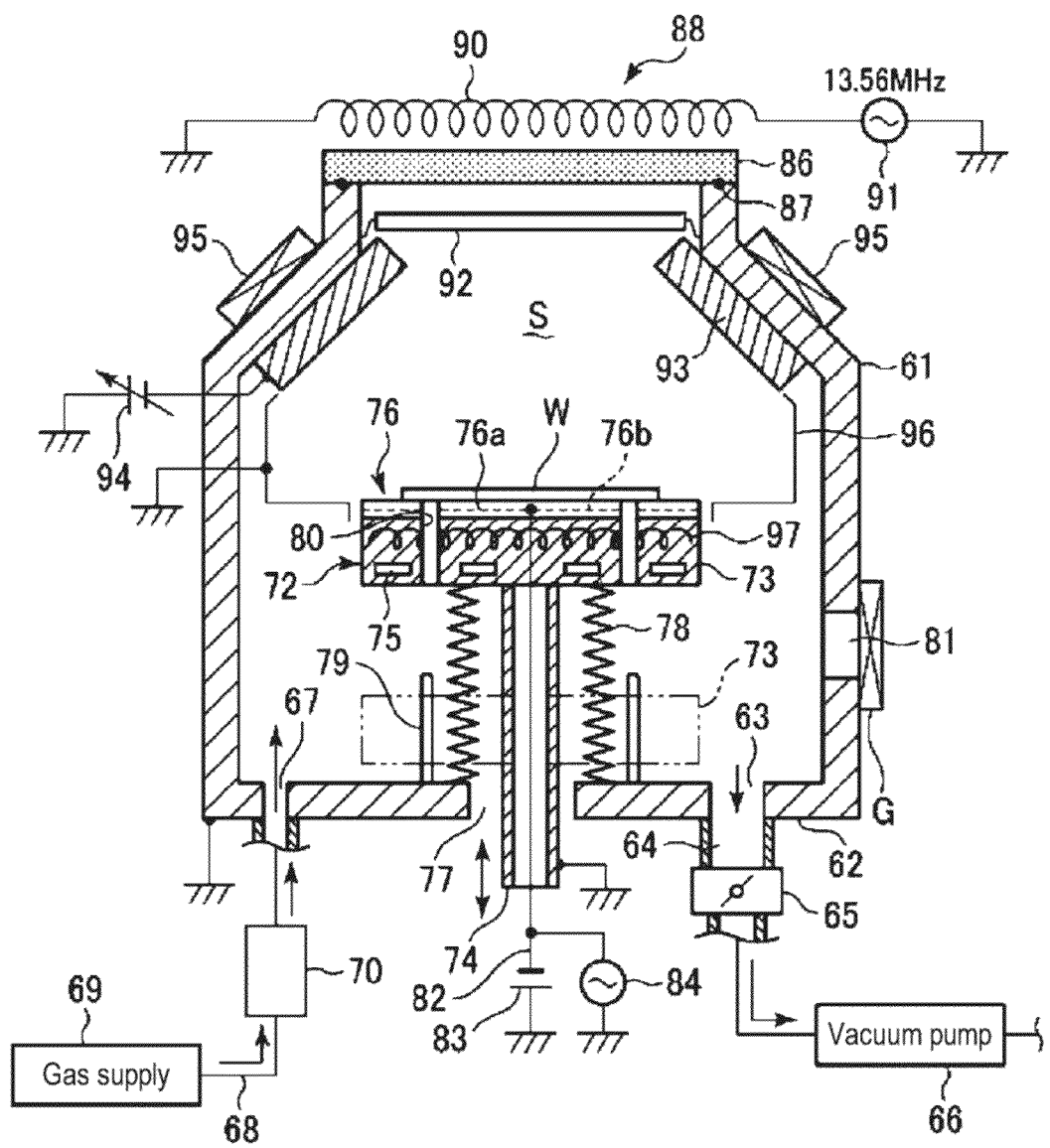
FIG. 12 is a sectional view of an example of a PVD system suitable for use in a copper film formation device and a tantalum (Ta) formation device.

Hereinafter, a PVD system suitable for use in the copper film formation device 42a and 42b and the tantalum formation device 32a and 32b in the film formation system 100 will be described. FIG. 12 is a sectional view of an example of a PVD system.

By way of example of the PVD system, an inductively coupled plasma (ICP)-type plasma sputtering device, which is an iPVD system, will be described herein.

As shown in FIG. 12, this PVD system includes a cylindrical processing chamber 61 made of, for example, aluminum or the like. The processing chamber 61 is grounded and a bottom portion of the processing chamber 61 is provided with an exhaust hole 63, to which an exhaust pipe 64 is connected. A throttle valve 65 and a vacuum pump 66 for pressure control are connected to the exhaust pipe 64, so that an inside of the processing chamber 61 can be vacuum. In addition, the bottom portion 62 of the processing chamber 61 is provided with a gas inlet 67 through which a predetermined gas is introduced into the processing chamber 61. The gas inlet 67 is connected to a gas supply pipe 68, to which a gas supply source 69 for supplying a rare gas, as a plasma excitation gas, for example, Ar gas, or other required gas, for example, N$_2$ gas, is connected. In addition, a gas control unit 70 composed of a gas flow controller, a valve, and the like, is mounted on the gas supply pipe 68.

The processing chamber 61 is provided with a mounting mechanism 72 that mounts wafers W to be processed thereon. The mounting mechanism 72 has a disc-shaped mounting table 73 and a hollow cylindrical support pillar 74 which supports the mounting table 73 and is grounded. The mounting table 73 is formed of a conductive material, such as an aluminum alloy, and grounded via the support pillar 74. The mounting table 73 is provided with a cooling jacket 75, to which a coolant is supplied through a coolant flow path (not shown). In addition, a resistance heater 97, covered with an insulation material, is embedded above the cooling jacket 75 in the mounting table 73. The resistance heater 97 is powered by a power supply (not shown). The mounting table 73 is provided with a thermocouple (not shown), and supplying the coolant to the cooling jacket 75 and supplying the electric power to the electrical resistance heater 97 can be controlled based on a temperature detected by the thermocouple, so that the wafer temperature can be controlled at a predetermined temperature.

A thin disc-shaped electrostatic chuck 76 is provided at an upper side of the mounting table 73 and is composed of a dielectric member 76a, such as alumina or the like, in which an electrode 76b is embedded, so that wafers W can be attracted and held by electrostatic force. In addition, a lower portion of the support pillar 74 extends downwards via an insertion through hole 77 centrally formed at the bottom portion 62 of the processing chamber 61. A lifting mechanism (not shown) is configured to allow the support pillar 74 to move up and down, and thus the entire mounting mechanism 72 can move up and down.

An extensible/contractible metal bellows is disposed to surround the support pillar 74. A top of the metal bellows is air-tightly joined to a lower surface of the mounting table 73, and its bottom is air-tightly joined to an upper surface of the bottom portion 62 of the processing chamber 61, thereby maintaining air-tightness within the processing chamber 61 while allowing the mounting mechanism 72 to move up and down.

In addition, for example, three support pins 79 (only two are shown in FIG. 12), which are vertically extending toward an upper part, is provided at the bottom portion 62, and the mounting table 73 is formed with pin insertion though holes 80, corresponding to the respective support pins 79. Thus, when the mounting table 73 is moved down, a wafer W can be received by top ends of the support pins 79 passing though the pin insertion though holes 80, and then can be carried between the mounting table and a transfer arm (not shown) introduced from outside. Thus, the processing chamber 61 is formed in a lower sidewall with a loading/unloading opening 81, on which a gate valve G, which is configured to be open and close, is disposed.

Further, a power supply 83 for the chuck is connected to the electrode 76*b* of the electrostatic chuck 76 though a feeding line 82. Direct current voltage is applied to the electrode 76*b* from the power supply 83 for the chuck, so that the wafer W is attracted and held by electrostatic force. In addition, an RF bias power supply 84 is connected to the feeding line 82, and RF bias power is supplied to the electrode 76*b* of the electrostatic chuck 76 through the feeding line 82 to thereby applying the bias power to the wafer W. A frequency of the RF power preferably ranges from 400 kHz to 60 MHz, and, for example, a frequency of 13.56 MHz is adopted.

A transmissive plate 86, which is made of a dielectric material, such as alumina, and has a transmission ability with respect to RF, is installed in an air-tight manner by interposing a seal member 87, such as an O-ring at the ceiling portion of the processing chamber 61. In addition, a plasma-generating source 88 is provided at an upper portion of the transmissive plate 86 and is configured to cause a rare gas for plasma excitation, for example Ar gas, to be a plasma state in a processing space S within the processing chamber 61 to generate plasma. Here, as a gas for plasma excitation, other rare gases, for example, He, Ne, Kr, and the like may be used instead of Ar.

The plasma-generating source 88 has an induction coil 90 corresponding to the transmissive plate 86, and, for example, a RF power supply 91 of 13.56 MHz for generating plasma is connected to the induction coil 90, so that RF power is introduced into the processing space S through the transmissive plate 86 to thereby producing an induced electric field.

In addition, a baffle plate 92 made of, for example, aluminum and configured to spread introduced RF power is disposed directly under the transmissive plate 86. A target 93 is provided at a lower portion of the baffle plate 92, and the target 93 is formed with copper or Tantalum and laterally surrounds an upper section of the processing space S to have an inwardly inclined annular (a truncated cone shell-shaped) cross-section, and a voltage variable DC power supply 94 for targets configured to apply DC power to Ar ions is connected to the target 93. It should be understood that an AC power supply may be used instead of the DC power source.

In addition, a magnet 95 is provided at an outer peripheral side of the target 93 to apply a magnetic field thereto. The target 93 is sputtered by Ar ions in the plasma and mostly ionized when passing though plasma.

Further, a cylindrical protective cover member 96, which is made of, for example, aluminum or copper and surrounds the processing space S, is provided at a lower portion of the target 93. The protective cover member 96 is grounded and its lower portion is inwardly bent to be disposed in the vicinity of side portions of the mounting table 73. Thus, an inner end portion of the protective cover member 96 is disposed to surround the outer peripheral side of the mounting table 73.

In the PVD system as set forth above, a wafer W is loaded into the processing chamber 61 as shown in FIG. 12, and then this wafer W is mounted on the mounting table 73 and attracted by the electrostatic chuck 76. Thereafter, the following operations are performed under the control of the controller 104. Here, the temperature of the mounting table 73 is adjusted by controlling the supply of coolant to the cooling jacket 75 and the supply of electric power to the electrical resistance heater 97, based on the temperature detected by the thermocouple (not shown).

First, the gas controller 70 is operated to allow a predetermined amount of Ar gas to flow into the processing chamber 61 having been evacuated to a predetermined vacuum by actuating the vacuum pump 66, while maintaining the processing chamber 61 at a predetermined vacuum level by controlling the throttle valve 65. Thereafter, DC power is applied to the target 93 from the variable DC power supply 94, and RF power (plasma power) is applied to the induction coil 90 from the RF power supply 91 of the plasma-generating source 88. In addition, the RF bias power supply 84 for bias supplies a RF power for a predetermined bias to the electrode 76*b* of the electrostatic chuck 76.

As a result, Ar plasma is generated by the RF power applied to the induction coil 90 thereby producing Ar ions, and these Ar ions are drawn by the DC power applied to the target 93 to collide, thereby emitting particles, which the target 93 are sputtered. Here, the amount of particle emission is optimally controlled by the DC voltage applied to the target 93.

The particles from the sputtered target 93 are mostly ionized while passing through the plasma. Here, the particles emitted from the target 93 are scattered in a downward direction, with ions and electrically neutral atoms being mixed. In particular, increase in pressure within the processing chamber 61 to a certain degree to increase the density of plasma allows the particles to be ionized highly efficiently. Here, the ionization rate is controlled by the RF power supplied from the RF power supply 91.

When the ions enter into an ion sheath region of a several mm thickness, which is created on a surface of the wafer W by the RF bias power applied to the electrode 76*b* of the electrostatic chuck 76 from the RF bias power supply 84, the ions have strong directionality, which causes attraction of the ions to the wafer W in an accelerated manner, whereby the ions are deposited on the wafer W. As a result, the copper film or tantalum is formed.

In forming the copper film, the wafer temperature is set high (65 degrees C. to 350 degrees C.), the bias power applied to the electrode 76*b* of the electrostatic chuck 76 from the RF bias power supply 84 is adjusted to adjust for forming the copper film and Ar etching, and fluidity of copper becomes improved, so that copper can be completely buried even in a trench or a hole with a narrow opening.

In addition, the PVD system is not limited to the iPVD system, but may include a typical sputter, an ion plating device, and the like.

[CVD System]

Figure 13:
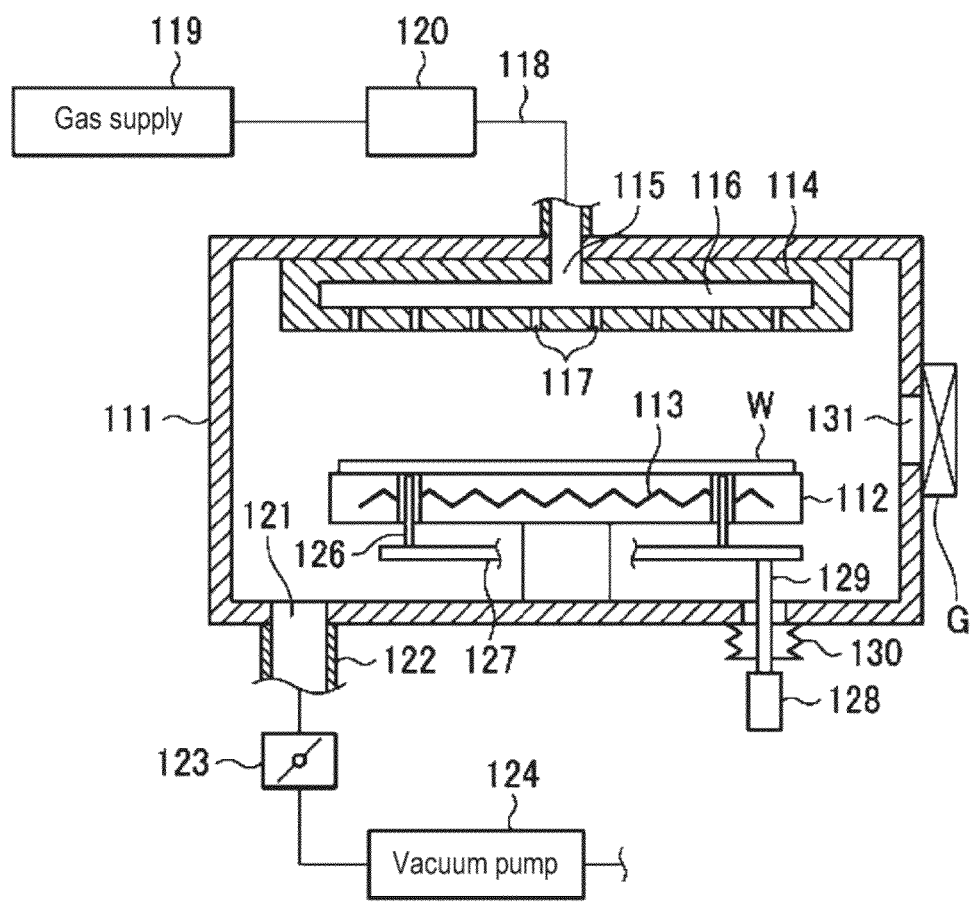
FIG. 13 is a sectional view of an example of a CVD system suitable for use in a $MnO_x$ film formation device and a ruthenium film formation device.

Hereinafter, a CVD system suitable for use in the $MnO_x$ film formation device 14*a* and 14*b* and the ruthenium film formation device 34*a* and 34*b* in the film formation system 100 will be described. FIG. 13 is a sectional view of an example of a CVD system configured to form a $MnO_x$ film or a ruthenium film by thermal CVD. Alternatively, the CVD system may be replaced with an ALD device by changing a gas supply system into the other one allowing an alternate gas supply.

As shown in FIG. 13, the CVD system has a cylindrical processing chamber 111 made of, for example, aluminum or the like. The processing chamber 111 is provided with a mounting table 112 made of ceramics, such as AlN and configured to mount a wafer W on the mounting table 112, and a heater 113 is disposed in the mounting table 112. The heater 113 generates heat by feeding power from a heater power supply (not shown).

The processing chamber 111 is provided at the ceiling thereof with a showerhead 114 which introduces a process gas for forming a film or a purge gas into the processing chamber 111 in a shower shape and is arranged to face the mounting table 112. The showerhead 114 has a gas inlet 115 at an upper portion of the showerhead 114, is formed with a gas diffusion space 116, and is formed with a plurality of gas discharge holes 117 in a bottom surface of the showerhead 114. A gas supply pipe 118 is connected to the gas inlet 115, and a gas supply source 119 for supplying a process gas for film formation or a purge gas is connected to the gas supply pipe 118. In addition, a gas control unit 120 composed of a gas flow controller, a valve, and the like is mounted on the gas supply pipe 118.

Further, when a film is formed by ALD, two or more gas supply sources 119 and gas supply pipes 118 are provided, and two or more different gases are alternately supplied with purge interposed in the processing chamber 111.

The processing chamber 111 is formed at a bottom portion thereof with an exhaust hole 121, to which an exhaust pipe 122 is connected. A throttle valve 123 and a vacuum pump 124 for controlling the pressure are connected to the exhaust pipe 122, so that it is possible to make an inside of the processing chamber 111 into a vacuum state.

The mounting table 112 is provided with three (only two are shown) wafer support pins 126 for wafer transfer, which are configured to protrude from and retreat into the mounting table 112, and these wafer support pins 126 are fixed to a support plate 127. Moreover, the wafer support pins 126 move up and down via the support plate 127 by vertically moving a rod 129 by a drive mechanism 128 such as an air cylinder or the like. Reference numeral 130 denotes a bellows. In addition, a wafer loading/unloading opening 131, which can be opened/closed by a gate valve G, is formed at a sidewall of the processing chamber 111. Wafers are loaded/unloaded while opening the gate valve G.

In the CVD system as set forth above, after opening the gate valve G and a wafer W is mounted on the mounting table, when the gate valve G is closed, the processing chamber 111 is evacuated by the vacuum pump to adjust the inner pressure of the processing chamber 111 to a predetermined pressure, and the wafer W on the mounting table 112 is heated to a predetermined temperature by the heater 113, a process gas is introduced from the gas supply source 119 into the processing chamber 111 via the gas supply pipe 118 and the showerhead 114. As a result, the reaction of the process gas is performed on the wafer W, and thus a $MnO_x$ film or a ruthenium film is formed on the surface of the wafer W.

[Hydrogen Radical Treatment Device]

Hereinafter, an example of a hydrogen radical treatment device will be described.

Figure 14:
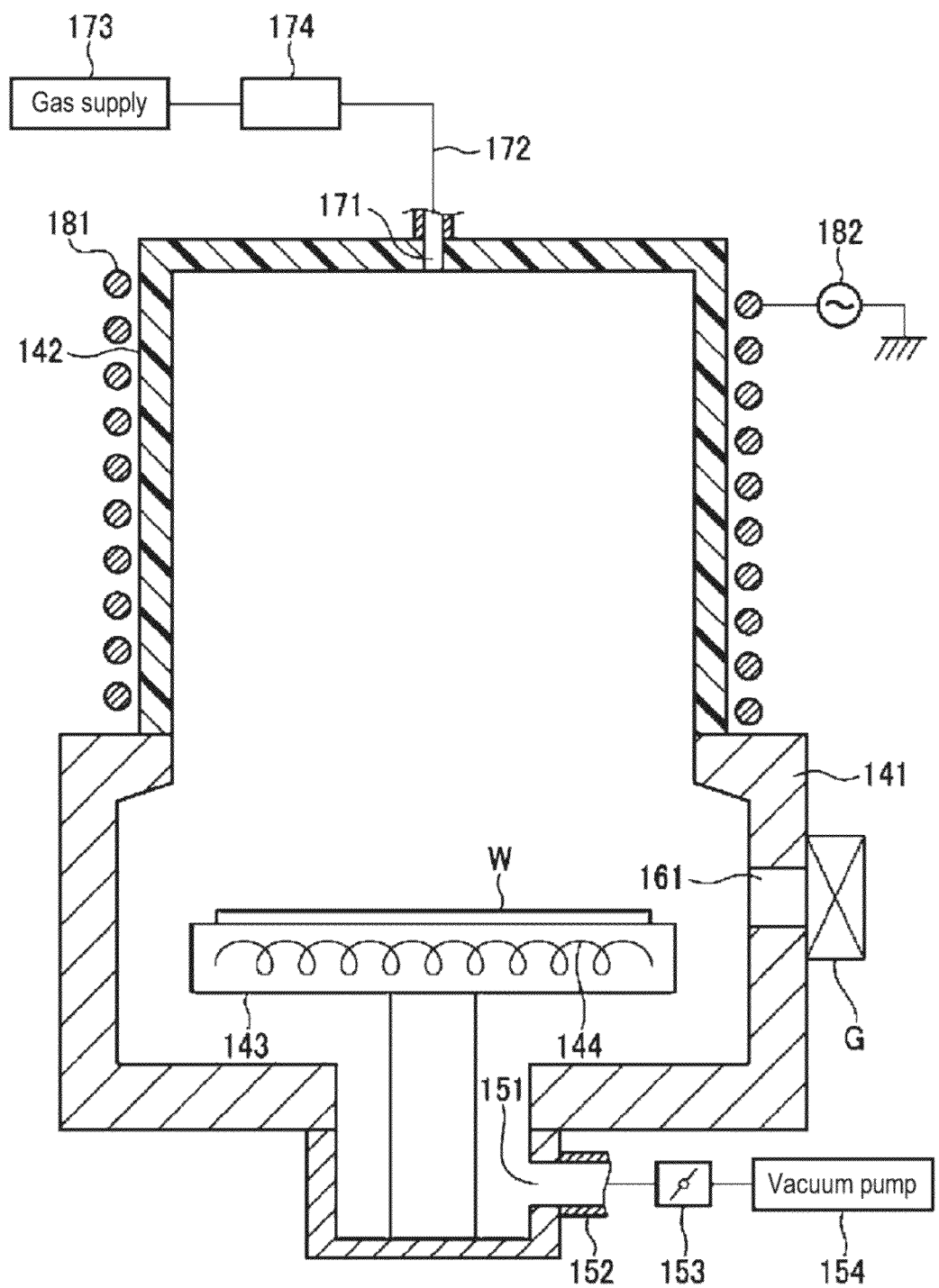
FIG. 14 is a sectional view of an example of a hydrogen radical treatment device.

FIG. 14 is a sectional view showing a hydrogen radical treatment device, and an example of generating hydrogen radicals within a processing chamber by remote plasma treatment will be described.

As shown in FIG. 14, the hydrogen radical treatment device has a cylindrical processing chamber 141 made of aluminum or the like and configured to perform hydrogen radical treatment; and a cylindrical bell jar 142 made of a dielectric material and disposed on a top side of the processing chamber 141. The bell jar 142 has a smaller diameter than that of the processing chamber 141, and wall portions of the processing chamber 141 and the bell jar 142 are air-tightly formed. In addition, the processing chamber 141 and the bell jar 142 internally communicate with each other.

The processing chamber 141 is provided with a mounting table 143 made of ceramics such as AlN or the like and configured to mount a wafer W thereon, and a heater 144 is embedded in the mounting table 143. Power is fed to the heater 144 from a heater power supply (not shown), thereby generating heat. The mounting table 143 is provided with three wafer support pins (not shown) for wafer transfer, which is configured to protrude from and retreat into the surface of the mounting table 143.

An exhaust port 151 is formed at a bottom portion of the processing chamber, and this exhaust port 151 is connected to an exhaust pipe 152. A throttle valve 153 and a vacuum pump 154 for pressure control are connected to the exhaust pipe 152, so that it is possible to evacuate insides of the processing chamber 141 and the bell jar 142. In addition, a wafer loading/unloading port 161 is formed at a sidewall of the processing chamber 141, and the wafer loading/unloading port 161 is configured to be opened and closed by a gate valve G. The loading or unloading of the wafers W is performed while opening the gate valve G.

A gas inlet 171 is formed at the center of a ceiling wall of the bell jar 142. A gas supply pipe 172 is connected to the gas inlet 171, and a gas supply source 173 for supplying a hydrogen gas or an inert gas used for hydrogen radical treatment is connected to the gas supply pipe 172. In addition, a gas controller 174 composed of a gas flow control unit, valve, and the like, is mounted on the gas supply pipe 172.

A coil 181, as an antenna, is wound around the bell jar 142. An RF power supply 182 is connected to the coil 181. The RF power is applied to the coil 181 while supplying hydrogen gas and an inert gas into the bell jar 142 to thereby generating inductively coupled plasma within the bell jar 142, so that hydrogen plasma treatment is performed with respect to the $MnO_x$ film of the wafer W within the processing chamber.

In the hydrogen radical treatment as set forth above, after opening the gate valve G, a wafer W is mounted on the mounting table 143, and then, after closing the gate valve G, the processing chamber 141 and the bell jar 142 are evacuated by the vacuum pump 154 to have a predetermined pressure within the processing chamber 141 and the bell jar 142, while heating the wafer W on the mounting table 143 to a predetermined temperature by the heater 144. Then, a process gas or an inert gas from the gas supply source 173 is supplied into the processing chamber 141 via the gas supply pipe 172 and the gas inlet 171, while applying RF power from the RF power supply 182 to the coil 181 to thereby generating inductively coupled plasma through excitation of the process gas or the inert gas within the bell jar 142, and the inductively coupled plasma is introduced into the processing chamber 141. As a result, the $MnO_x$ film of the wafer W is subjected to hydrogen plasma treatment by hydrogen radicals in the generated plasma.

Other Application

While the embodiments of the present invention have been described, the present invention may be variously modified without being limited to the above embodiments. For example, the film formation system is not limited to the system shown in FIG. 8, which is composed of two separate film formation units, i.e. the first and second film formation units, and may include a system in which the first and second film formation units are incorporated. In addition, the film formation system may be provided with three or more film formation units, and processes in the corresponding treatment unit may be performed in different combination thereof.

While, in the above embodiments, the present disclosure has been described with respect to a wafer having a trench and a via (hole), it should be understood that the present disclosure may be applied to a wafer having a trench alone or a wafer having a hole alone. Moreover, the present disclosure may be applied to forming copper wirings used in devices of various structures such as a 3D mounting structure or the like, in addition to a single damascene structure and a double damascene structure.

Further, while, in the above embodiments, by way of example of a wafer to be processed, a semiconductor wafer has been described, it should be understood that the semiconductor wafer may include a compound semiconductor such as GaAs, SiC, GaN or the like as well as a silicon substrate, and the present disclosure is not limited to semiconductor wafers, but may be applied to a glass substrate for use in FPDs (Flat Panel Displays), such as a liquid crystal display, and a ceramic substrate.

According to the present disclosure in some embodiments, a thin $MnO_x$ film is formed as a self-aligned barrier, hydrogen radical treatment is performed on a surface of the $MnO_x$ film to reduce the surface of the $MnO_x$ film, and then a process for placing a metal, such as Ta, more active than ruthenium, on the surface of the $MnO_x$ film is performed such that the metal contributes to nucleation upon forming an ruthenium film, whereby a high quality ruthenium film can be formed thin and uniformly even in a fine trench or a via (hole). As a result, it is possible to secure good embedment properties of copper.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A method of forming a copper wiring buried in a recess portion of a predetermined pattern formed in an interlayer insulation layer of a substrate, the method comprising:
    forming a manganese oxide film at least on a surface of the recess portion, the manganese oxide film serving as a self-aligned barrier film through reaction with the interlayer insulation layer;
    performing hydrogen radical treatment with respect to a surface of the manganese oxide film;
    placing a metal more active than ruthenium on the surface of the manganese oxide film after the hydrogen radical treatment;
    forming a ruthenium film on the surface where the metal more active than ruthenium is present; and
    forming a copper film on the ruthenium film by physical vapor deposition (PVD) to bury the copper film in the recess portion,
    wherein the placing a metal more active than ruthenium is performed by discontinuously forming the metal on a wall portion of the recess portion.

2. The method of claim 1, wherein the placing a metal more active than ruthenium is performed by depositing the metal by PVD.

3. The method of claim 1, wherein, in the placing a metal more active than ruthenium, the metal comprises a metal selected from the group consisting of tantalum, cobalt, tungsten, and titanium.

4. The method of claim 1, wherein the ruthenium film is formed by chemical vapor deposition (CVD).

5. The method of claim 1, wherein the copper film is formed by plasma sputtering.

6. A non-transitory storage medium operating on a computer and storing a program for controlling a copper wiring forming system, wherein, when the program is executed, the program allows the computer to control the copper wiring forming system to perform the method of claim 1.

* * * * *